(12) United States Patent
Fiorito et al.

(10) Patent No.: US 7,804,078 B2
(45) Date of Patent: Sep. 28, 2010

(54) DEVICE HAVING GALVANIC OPTOCOUPLING

(75) Inventors: Massimiliano Fiorito, Sant'Agata Li Battiati (IT); Mariantonietta Monaco, Riccia (IT); Gianpiero Montalbano, Tremestieri Etneo (IT); Salvatore Coffa, Tremestieri Etneo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 64 days.

(21) Appl. No.: 12/019,371

(22) Filed: Jan. 24, 2008

(65) Prior Publication Data

US 2008/0283780 A1   Nov. 20, 2008

(30) Foreign Application Priority Data

Jan. 24, 2007   (IT)   .......................... MI2007A0102

(51) Int. Cl.
  *G02B 27/00*   (2006.01)
  *H01L 31/00*   (2006.01)
  *H01L 27/00*   (2006.01)
  *H01L 33/00*   (2010.01)

(52) U.S. Cl. .................. 250/551; 250/208.1; 250/214.1; 257/59; 257/93

(58) Field of Classification Search ................ 250/551, 250/239, 227.24, 216, 208.1, 214.1, 214 R; 257/10, 11, 59, 72, 227, 232–236, 431–435, 257/439, 444, 88, 92, 93, 98, 226, 257; 438/48, 438/69, 70

See application file for complete search history.

(56) References Cited

U.S. PATENT DOCUMENTS

| 5,949,085 A * | 9/1999 | Barrett ........................ 250/551 |
| 6,864,555 B2 * | 3/2005 | Worley ........................ 257/435 |

OTHER PUBLICATIONS

M. Munzer et al., Coreless Transformer A New Technology for Half Bridge Driver IC's, PCIM 2003 Conference, Nuremberg, 2003, 4 pages.

* cited by examiner

*Primary Examiner*—Georgia Y Epps
*Assistant Examiner*—Don Williams
(74) *Attorney, Agent, or Firm*—Lisa K. Jorgenson; E. Russell Tarleton; Seed IP Law Group PLLC (57) ABSTRACT

The present disclosure relates to an architecture of a device with galvanic optocoupling of the type having at least one optical source and one optical detector, optically connected by means of an insulation layer that functions to transmission optical signals, and having at least one input terminal and one output terminal, the optical source and the optical detector connected to a respective first and second voltage reference. The optical source is realized by a structure integrated directly above the insulation layer in correspondence with the optical detector, the architecture thus completely realized inside a single integration island.

25 Claims, 6 Drawing Sheets

DEVICE HAVING GALVANIC OPTOCOUPLING

BACKGROUND

1. Technical Field

The present disclosure relates to the architecture of a device having a galvanic optocoupling and, more specifically, to the galvanic optocoupling of at least one light source and an optical detector, optically connected through a transmission means and having at least one input terminal and one output terminal, the light source and the optical detector connected to respective first and second voltage references.

2. Description of the Related Art

As is known, certain applications require the use of components able to ensure a certain galvanic insulation between two different ports of a system, without penalizing the passage of a signal that encodes or contains a piece of information in the system itself. To this purpose, the use of galvanic optocouplers is known, i.e., devices able to transfer the desired information by means of an optical signal with suitable insulation characteristics.

This solution, widely present on sale, is usually realized by suitably assembling a light source, such as for example a light emitting diode (LED), realized with direct-gap semiconductors (type III-V) and a detector, such as for example usually a photodiode or a phototransistor, typically realized by silicon.

In substance, a galvanic optocoupler is essentially a safety device that allows two different sections, in particular an input stage and an output stage, of a system to exchange commands and information in a unidirectional way while remaining separate from the electric point of view. In particular, the signal transmission through the galvanic optocoupler occurs by means of light pulses that pass through an insulation layer transparent to light but with high dielectric rigidity.

An optical coupling thus occurs between the two parts of the system connected by the galvanic optocoupler which, however, remain electrically insulated one from the other (in particular, they do not have ground terminals in common).

Figure 1:
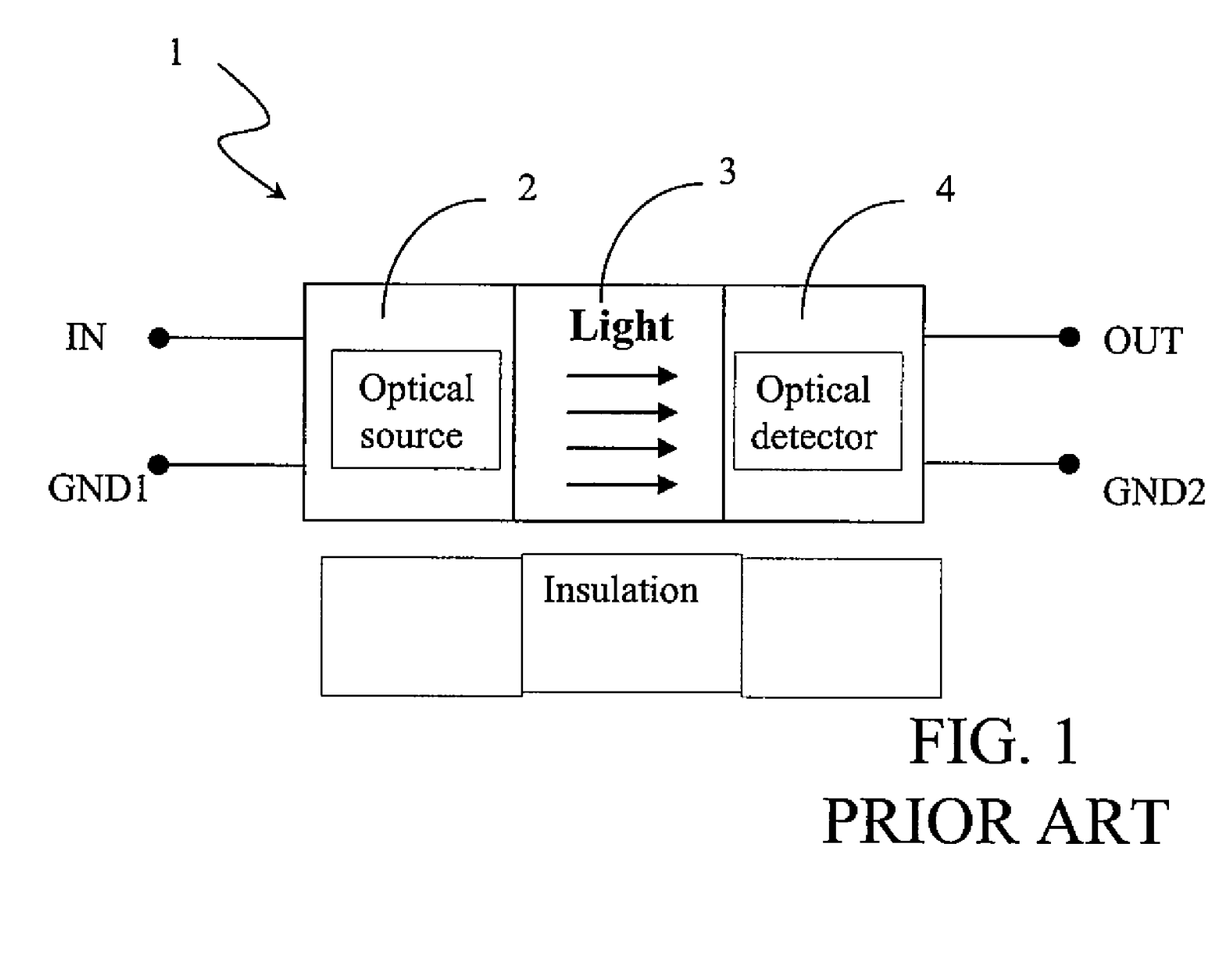
FIG. 1 shows a general scheme of a known galvanic optocoupler.

A galvanic optocoupler of the known type is schematically shown in FIG. 1, globally indicated with 1. In particular, the galvanic optocoupler 1 connects a first circuit node, or input IN, to a second circuit node, or output OUT, ensuring the galvanic insulation of the respective voltage references GND1 and GND2 due to the conversion of an input electric signal into an optical signal.

The galvanic optocoupler 1 thus includes an input stage, in particular a light or optical source 2 connected, through an intermediate stage 3 realized by a transmission means, and in particular an insulation layer, to an output stage or optical detector 4. In particular, the insulation layer of the intermediate stage 3 is a means suitable for transmitting an optical signal (indicated with Light in the figure).

More in particular, the input or transmitter optical source 2 or transmitter emits a power that is transferred to the optical detector 4 or output photodetector. In this way, if the transmission means 3 through which the transmitter and photodetector communicate shows a good transparency and a good degree of electric insulation, the galvanic optocoupler 1 completely realizes the transmission functionality and simultaneous insulation requested.

For realizing a galvanic optocoupler device an assembly technique must be used that provides a good optical coupling between source and detector, without penalizing the galvanic insulation between the input and output gates of the device itself.

Two assembly techniques are known and widely used in the optoelectronic field that obtain a galvanic optocoupler device having these characteristics, and in particular:

1) face to face assembly technique.

Figure 2A:
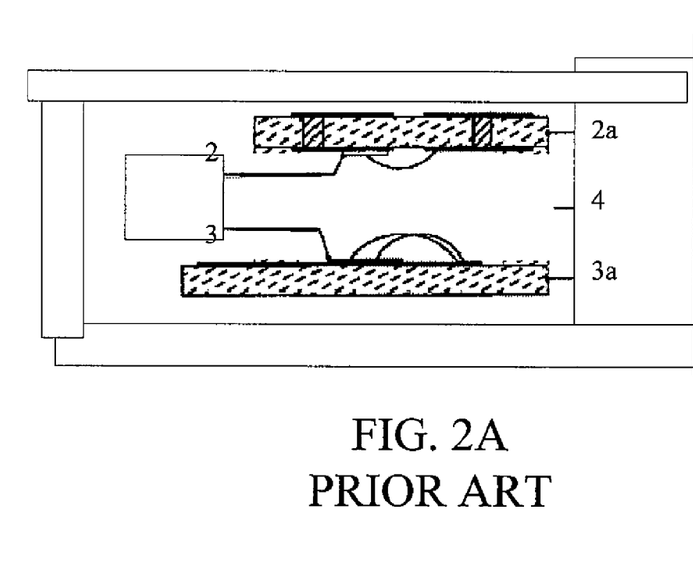
FIGS. 2A, 2B show respective embodiments of a known galvanic optocoupler.

This technique, schematically shown in FIG. 2A, consists in facing an optical source 2 and an optical detector 4, by means of respective self-aligned frames 2a and 3a electrically separated between input and output. The optical coupling is ensured in that the optical detector 4 is directly lightened by the optical source 2, while the galvanic insulation is obtained using an insulating, optically transparent resin inserted between the two components according to the transmission means 3.

2) dielectric mirror assembly technique.

Figure 2B:
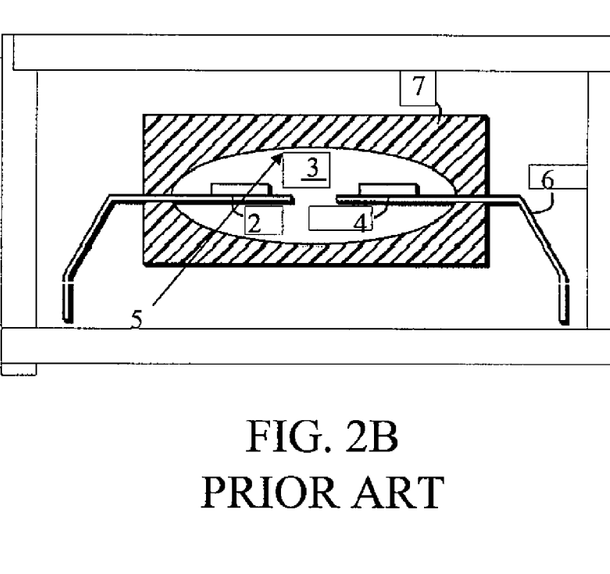

This technique, schematically shown in FIG. 2B, consists in the use of an optical reflector 5 (or dome) which concentrates and conveys part of the optical power emitted by the optical source 2 onto the optical detector 4, both glued on a planar frame 6 with two islands that electrically separate the input from the output. An insulating, optically transparent resin incorporates the optical source 2 and the optical detector 4 and serves as support for the realization of the optical reflector 5 with function of transmission means 3. Finally, the galvanic optocoupler device includes a containment package 7.

Figure 2C:
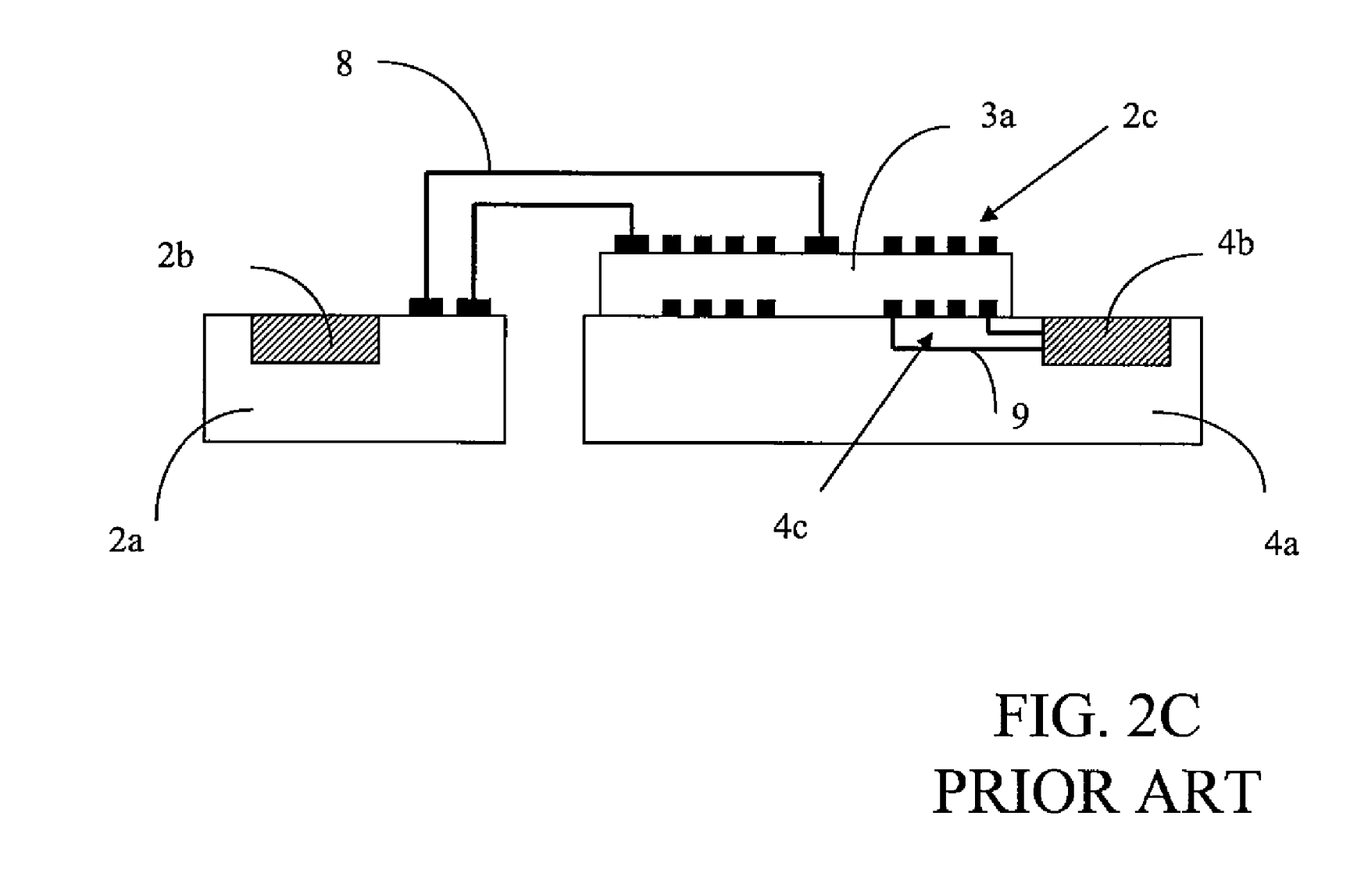
FIG. 2C shows an embodiment of a known galvanic coupler with magnetic transmission according to the prior art.

The use of an insulator with magnetic transmission or i-coupler, as galvanic optocoupler device, as schematically shown in FIG. 2C is also known.

In particular, the i-coupler structure there shown has been obtained in the so called "Coreless Transformer" technology, as described for example in the article by Munzer et al. entitled "Coreless transformer a new technology for half bridge driver IC's", PCIM 2003 Conference, Nuremberg, 2003.

In this structure, a primary coil 2a and a secondary coil 4a comprise respective integrated circuits, 2b and 4b, provided with respective active parts, 2c and 4c. In particular, the active part 2c of the primary coil 2a is realized above an insulation layer 3a and magnetically communicates with the secondary coil 4a through its corresponding active part 4c.

In particular, in the structure shown in FIG. 2C, the primary coil 2a is connected to its active part 2c by means of suitable conductive paths 8 while the secondary coil 4a is connected to its active part 4c by means of suitable bonding wires 9.

Although advantageous under several aspects, these solutions are not however exempt from drawbacks. In particular, in the face to face assembly technique, the realization of two different support frames of optical source 2 and optical detector 4 as well as their alignment is problematic, in particular expensive. The step of gluing the respective elements to these support frames is as much difficult.

Similarly, the dielectric mirror assembly technique requires the use of at least two different molding compounds; in particular the compound realizing the optical reflector 5 is very expensive and difficult to be dispensed.

Finally, further difficulties can be found in the realization of the magnetically connected active parts of the primary and secondary coil in the case of the "Coreless Transformer" assembly technique.

One technical problem addressed by the present disclosure is that of devising an architecture of a device having galvanic optoinsulation suitable for being completely integrated by using integration process flows widely employed in the field of microelectronics, overcoming the limits and drawbacks still affecting the galvanic optocoupler devices realized according to prior designs and the related assembly techniques.

BRIEF SUMMARY

The present disclosure is directed to using an optical source directly integrated above the insulation source of the optical detector, the galvanic optocoupler thus being contained in a single island, simplifying the type of package to be used for the containment of the galvanic optocoupler.

On the basis of this approach, the technical problem is solved by an architecture of a device having a galvanic optocoupling of the type including at least one optical source and an optical detector, optically connected by means of an insulation layer with function of transmission means and having at least one input terminal and one output terminal, the optical source and the optical detector 4-connected to respective first and second voltage references. The optical source is realized by a structure directly integrated above the insulation layer, in correspondence with the optical detector, the architecture being thus completely realized inside a single integration island.

In accordance with one embodiment of the present disclosure, a galvanic optocoupler is provided, the optocoupler including a single integration island on a single die; an input stage coupled to a first ground potential; an optical source formed in the island and optically coupled to the input stage; an optically conductive electrical insulation layer formed in the island adjacent the optical source; an optical detector formed in the island adjacent to the insulation layer in optical communication with the optical source through the insulation layer; and an output stage optically coupled to the optical detector and electrically coupled to a second ground potential that is electrically insulated from the first ground potential.

In accordance with another aspect of the foregoing embodiment, the input stage and the output stage, at least one or both, are formed on a separate die than on the single die.

In accordance with another aspect of the foregoing embodiment, the optical source is formed by a directly integrated structure above the insulation layer.

In accordance with another embodiment of the present disclosure, a device is provided, the device includes a galvanic optocoupler that has a single integration island on a single die; an input stage coupled to a first ground potential; an optical source formed in the island and optically coupled to the input stage; an optically conductive electrical insulation layer formed in the island adjacent the optical source; an optical detector formed in the island adjacent to the insulation layer in optical communication with the optical source through the insulation layer; and an output stage optically coupled to the optical detector and electrically coupled to a second ground potential that is electrically insulated from the first ground potential.

In accordance with another aspect of the foregoing embodiment, at least one of the input stage and the output stage are formed on a separate die than the single die.

In accordance with another aspect of the foregoing embodiment, the optical source is formed in an integrated structure above the insulation layer.

In accordance with another aspect of the foregoing embodiment, the input stage and the output stage are both formed on the single integration island on the single die.

BRIEF DESCRIPTION OF THE SEVERAL VIEWS OF THE DRAWINGS

The characteristics and the advantages of a device having galvanic optocoupling according to this disclosure will be apparent from the following description of an embodiment thereof given by way of indicative and non limiting example with reference to the annexed drawings.

In these drawings.

DETAILED DESCRIPTION

Figure 3A:
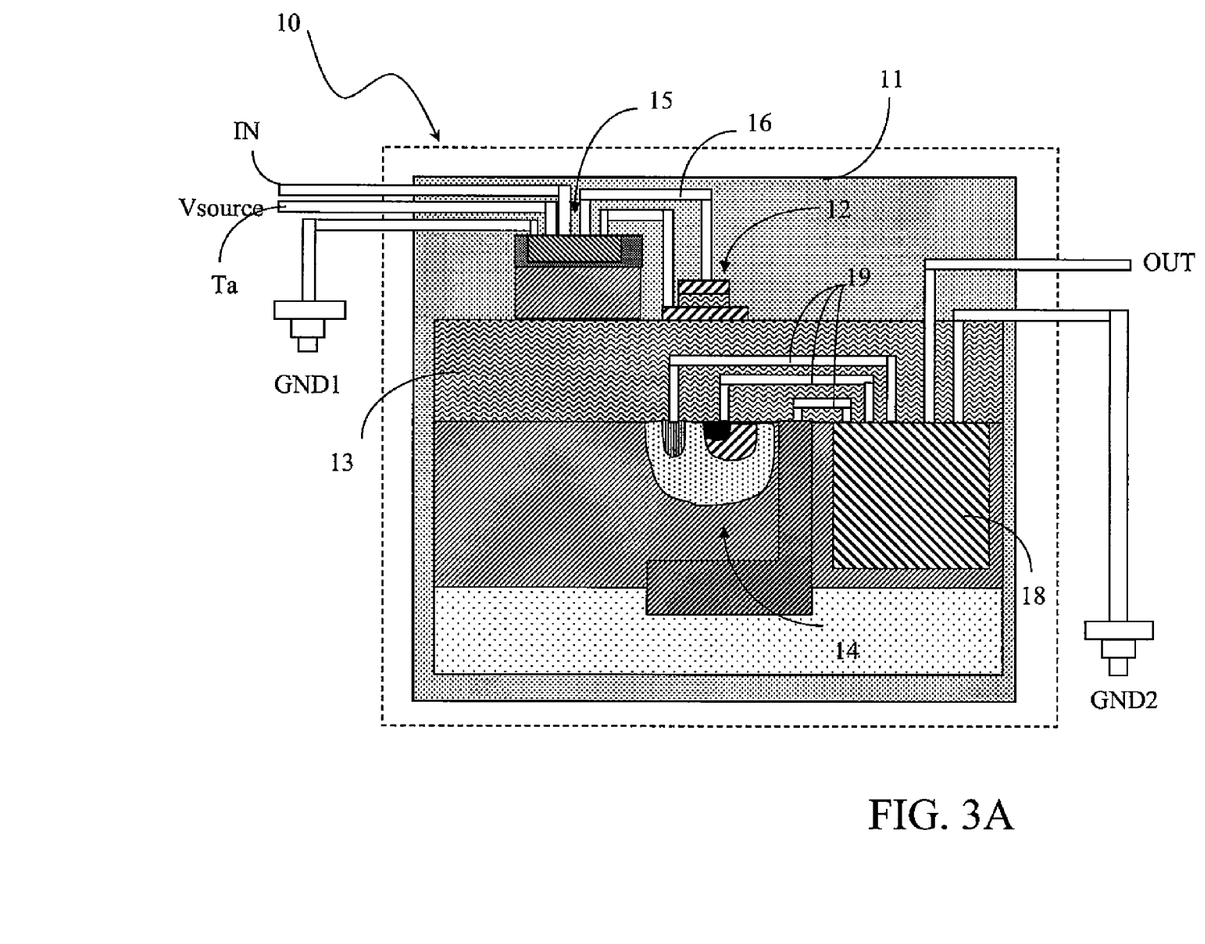
FIG. 3A schematically shows an architecture of a device having galvanic optocoupling realized according to the present disclosure.

With reference to these figures, and in particular to FIG. 3A, reference numeral 10 globally and schematically indicates an architecture of a device having galvanic optocoupling realized according to the present disclosure.

As may be seen in connection with the known devices, the architecture 10 realizes a device equipped with a galvanic optocoupler having at least one optical source 12 and one optical detector 14 optically connected by means of an insulation layer 13 having the function of a transmission means. The optical source 12 and the optical detector 14 are connected to respective voltage references, in particular first and second ground references, GND1 and GND2, respectively.

In particular, advantageously according to the disclosure, the optical source 12 is realized by a structure that is directly integrated above the insulation layer 13 in correspondence with the optical detector 14. In this way, the architecture 10 is completely realized inside a single integration island 11.

The optical source 12 is in particular connected to an input stage 15, for example a driving device or driver, in turn connected to an input terminal IN and to the first ground reference, GND1, by means of suitable connections 16, in particular bonding wires.

The input stage 15 can also be integrated in a separated die with respect to the one containing the first integration island 11. Thus, the galvanic optocoupler would be formed by the optical source 12, by the insulation layer 13 and by the optical detector 14, as well as possibly the output stage 18. This separated die being suitably glued on the insulation layer 13.

It is further possible to integrate both the optical source 12 and the input stage 15 above the insulation layer 13. In this case, the connections 16 will be realized by suitable metal tracks.

The input stage 15 is also connected to a supply terminal Ta receiving a supply voltage Vsource.

In the embodiment shown in FIG. 3A, the optical detector 14 is realized in the form of a phototransistor and is also connected to a possible output stage 18 of the device, in particular an amplification stage or a control logic, by means of suitable connections 19 such as metallization, vias, tracks, wires, or the like.

The output stage 18 is further connected to an output terminal OUT and to the second ground terminal, GND2.

In this way an architecture of a galvanic optocoupler device 10 integrated in an integration island 11 is obtained, considerably simplifying the realization of a containment package of the device itself, in practice allowing the use of a single island package of the standard type.

It is also to be noted that the presence of the insulation layer 13 ensures the desired galvanic insulation between the input stage 15 and the output stage 18 of the device thus obtained, as well as between the first and the second ground terminal, GND1 and GND2.

Still advantageously according to the disclosure, the optical source 12 is realized above the optical detector 14, thus ensuring the greatest optical coupling for the device thus obtained.

Figure 3B:
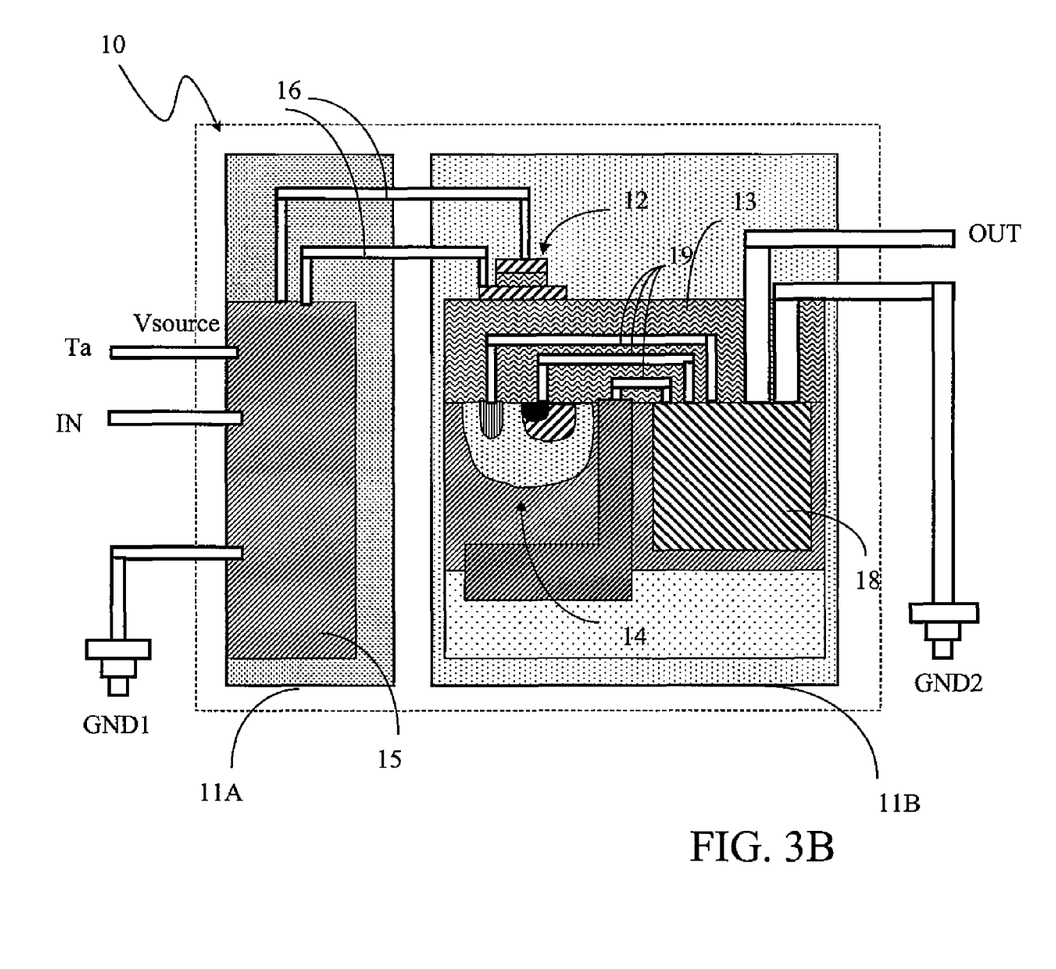
FIG. 3B schematically shows a further embodiment of the architecture of a device having galvanic optocoupling realized according to the present disclosure.

In a further embodiment, the architecture 10 includes at least one first and one second integration island, 11A and 11B, respectively, adapted for hosting distinct elements of the device.

More in particular, in the example shown in FIG. 3B, the first island 11A includes the input stage 15, for example a driving device or driver for the optical source 12, suitably connected to the input terminal IN, to the supply terminal Ta and to the first ground terminal, GND1.

This first island 11A is connected, by means of suitable connections 16, in particular by means of bonding wires, to the optical source 12, suitably realized above the optical detector 14 in the second island 11B. Also in the embodiment shown in FIG. 3B, this optical detector 14 is realized in the form of a phototransistor.

The second island 11B also includes the possible output stage 18 of the device, in particular an amplification stage or a control logic, in turn connected to the optical detector 14 by means of suitable connections 19 as described above.

The output stage 18 is further connected to the output terminal OUT and to the second ground terminal GND2.

It is immediately clear that the structures hosted in the integration islands 11A and 11B are very easy to integrate, making the architecture 10 usable in multiple fields of application.

It is also to be noted that the presence of these integration islands allows separation of the supply of at least the input stage 15, enabling realization of devices having galvanic optocoupling compatible with already known circuits.

It is also important to note that the architecture 10 does not impose constraints of any type on the realization of the elements connected to the output terminal OUT. In particular, the optical detector 14 and the output stage 18 can be integrated on a same die (with connections 19 realized by means of metal tracks) or realized in two separate dies and connected to each other by bonding wires as connections 19.

The architecture 10 according to the disclosure provides a device having galvanic optocoupling with a single unidirectional channel, i.e., a device wherein the information is transmitted from the input stage 15 to the output stage 18 and not vice versa.

Figure 4:
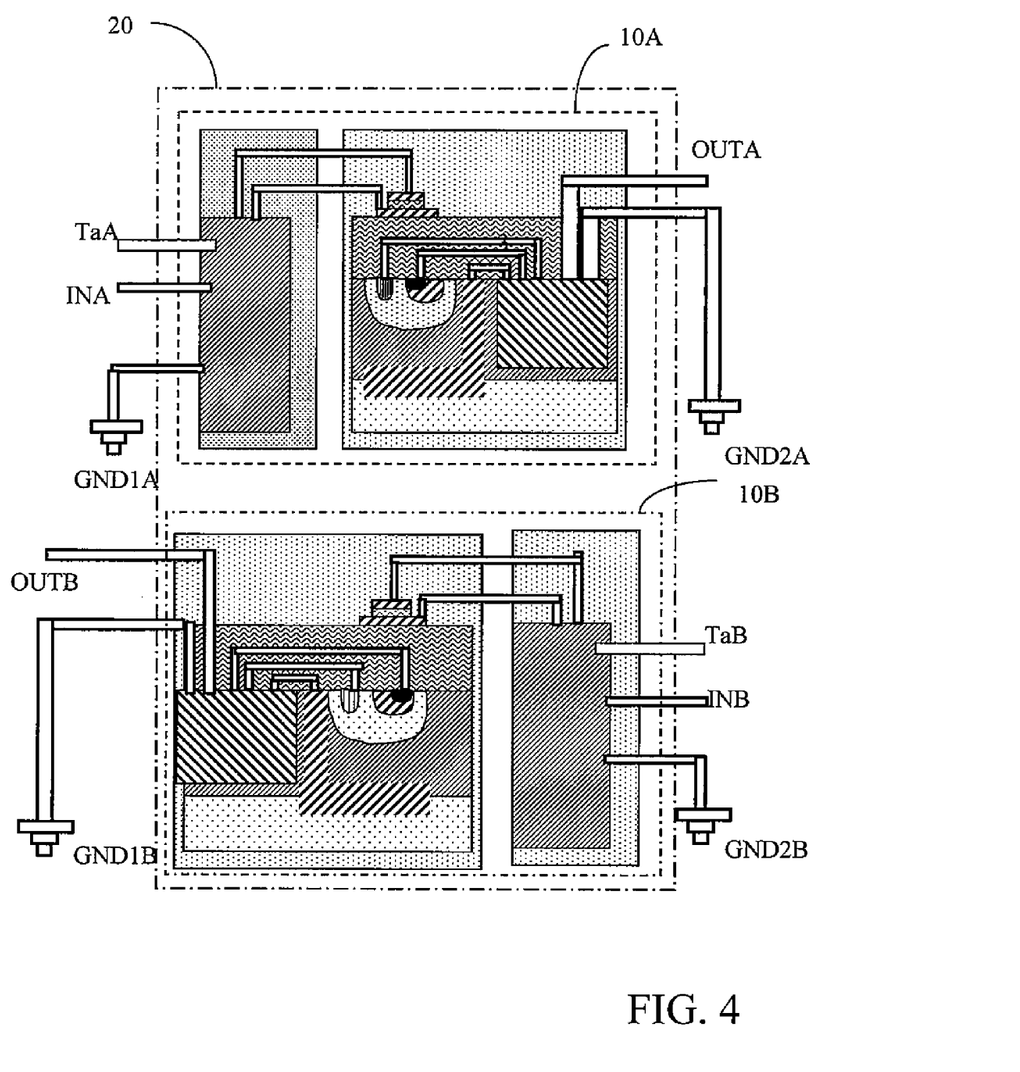
FIG. 4 schematically shows a configuration with two channels using the architecture of a device having the galvanic optocoupling of FIG. 3B.

It is also possible to realize a device having galvanic optocoupling of the bidirectional type by assembling, in a same package, two specular unidirectional architectures, 10A and 10B, as schematically shown in FIG. 4, globally indicated with 20.

Although each of the architectures 10A and 10B shown in FIG. 4 comprises two distinct integration islands of the type shown in FIG. 3B, the bidirectional device 20 can be obtained by means of two architectures each having one single integration island of the type shown in FIG. 3A.

In particular, in the bidirectional device 20 shown in FIG. 4 the information travels from the left to the right on a first channel, indicated with A, and in the opposite direction on a second channel, indicated with B, between the respective input and output terminals INA-OUTA and INB-OUTB, relative to the first architecture and to the second architecture of the device having galvanic optocoupler device, 10A and 10B. It is not in fact possible to realize a bidirectional communication with a single channel.

Also in the case of the bidirectional device 20, all the ground references are independent to ensure a correct galvanic insulation. In particular, the first architecture 10A is connected to respective first and second ground terminals, GND1A and GND2A, and similarly the second architecture 10B is connected to respective first and second ground terminals GND1B and GND2B.

In conclusion, advantageously according to the disclosure, an architecture has been proposed suitable for realizing a device having galvanic optocoupling in at least one first and one second integration island, suitably connected to respective ground terminals and hosting different elements of the device.

The main advantage of the architecture 10 according to the disclosure is that it can be integrated with processes compatible with mature and consolidated techniques, such as the silicon one, currently used in the field of the microelectronics. Moreover, the architecture 10 does not need particularly complex and expensive packages, any package with two islands of the known type being perfectly suitable for the purpose.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An architecture of a device having galvanic optocoupling, comprising: at least one optical source and one optical detector optically connected by means of an insulation layer adapted to function as an optical transmission means, and the device having at least one input terminal and one output terminal, said optical source and said optical detector connected to a respective first and second voltage reference, said optical source formed by a directly integrated structure above said insulation layer in optical correspondence with said optical detector, said architecture completely realized inside a single integration island formed from silicon as an integrated die.

2. The architecture of claim 1 wherein said optical source is connected to an input stage that in turn is connected to said input terminal and to said first voltage reference.

3. The architecture of claim 2 wherein the optical source is connected to said input stage by means of connections.

4. The architecture of claim 3 wherein said optical source and said input stage are realized on a same die and said connections are realized by means of metal tracks.

5. The architecture of claim 3 wherein said optical source and said input stage are realized in a first die and a second die, respectively, and said connections are realized by means of bonding wires.

6. The architecture of claim 5 wherein said second die whereon said input stage is realized is glued on said insulation layer on said first die whereon said optical source is realized.

7. The architecture of claim 2 wherein said input stage is further connected to a supply terminal of said device.

8. The architecture of claim 2, further comprising an output stage connected to said output terminal and second voltage reference as well as to said optical detector.

9. The architecture of claim 8 wherein said optical detector is connected to said output stage by means of connections.

10. The architecture of claim 8 wherein said output stage is an amplification stage of said device.

11. The architecture of claim 8 wherein said output stage comprises a control logic of said device.

12. The architecture of claim 8 wherein said optical detector and said output stage are realized on a same die and said connections are realized by means of metal tracks.

13. The architecture of claim 8 wherein said optical detector and said output stage are realized in a first die and a second die, respectively, and said connections are realized by means of bonding wires.

14. The architecture of claim 1 wherein the galvanic optocoupler comprises at least one phototransistor.

15. The architecture of claim 1 comprising at least one first and one second integration island respectively, for hosting distinct elements of said device, said first integration island comprising at least said input stage connected to said first ground reference and said second integration island comprising at least said optical source, said insulation layer and said optical detector thus forming a galvanic optocoupler completely contained in said second integration island in turn connected to said second ground reference.

16. The architecture of claim 15 wherein said second integration island further comprises said output stage of said device.

17. A galvanic optocoupler, comprising:
a single integration island formed from silicon as a single die;
an input stage coupled to a first ground potential;
an optical source formed in the single island and electrically coupled to the input stage;
an optically conductive electrical insulation layer formed in the single island adjacent the optical source;
an optical detector formed in the single island adjacent to the insulation layer in optical communication with the optical source through the insulation layer; and
an output stage electrically coupled to the optical detector and electrically coupled to a second ground potential that is electrically insulated from the first ground potential.

18. The galvanic optocoupler of claim 17 wherein the input stage and the output stage are formed in the single integration island on the single die.

19. The galvanic optocoupler of claim 17 wherein the optical source is formed by an integrated structure above the insulation layer.

20. A device, comprising:
a galvanic optocoupler, the galvanic optocoupler comprising:
a single integration island formed from silicon as a single die;
an input stage coupled to a first ground potential;
an optical source formed in the single island and electrically coupled to the input stage;
an optically conductive electrical insulation layer formed in the single island adjacent the optical source;
an optical detector formed in the single island adjacent to the insulation layer in optical communication with the optical source through the insulation layer; and
an output stage electrically coupled to the optical detector and electrically coupled to a second ground potential that is electrically insulated from the first ground potential.

21. The device of claim 20 wherein the input stage and the output stage are formed on the single integration island on the single die.

22. The device of claim 20 wherein the optical source is formed in an integrated structure above the insulation layer.

23. The device of claim 20 wherein at least one of the input stage and the output stage are formed on a separate die from the single die.

24. A bidirectional device, comprising:
a first and a second galvanic optocoupler being specular with respect to one another, each galvanic optocoupler comprising:
a single integration island formed from silicon as a single die;
an input stage coupled to a first ground potential;
an optical source formed in the single island and electrically coupled to the input stage;
an optically conductive electrical insulation layer formed in the single island adjacent the optical source;
an optical detector formed in the single island adjacent to the insulation layer in optical communication with the optical source through the insulation layer; and
an output stage electrically coupled to the optical detector and electrically coupled to a second ground potential that is electrically insulated from the first ground potential.

25. The bidirectional device of claim 24, wherein the first and second galvanic optocoupler are in a single package.

* * * * *